United States Patent
We et al.

(10) Patent No.: US 11,804,645 B2
(45) Date of Patent: Oct. 31, 2023

(54) MULTI-SIDED ANTENNA MODULE EMPLOYING ANTENNAS ON MULTIPLE SIDES OF A PACKAGE SUBSTRATE FOR ENHANCED ANTENNA COVERAGE, AND RELATED FABRICATION METHODS

(71) Applicant: QUALCOMM Incorporated, San Diego, CA (US)

(72) Inventors: Hong Bok We, San Diego, CA (US); Joan Rey Villarba Buot, Escondido, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 149 days.

(21) Appl. No.: 17/474,524

(22) Filed: Sep. 14, 2021

(65) Prior Publication Data
US 2023/0083146 A1 Mar. 16, 2023

(51) Int. Cl.
*H01Q 1/22* (2006.01)
*H01Q 1/38* (2006.01)
(Continued)

(52) U.S. Cl.
CPC .............. *H01Q 1/2283* (2013.01); *H01Q 1/38* (2013.01); *H01Q 1/422* (2013.01); *H01Q 1/526* (2013.01);
(Continued)

(58) Field of Classification Search
CPC ........ H01Q 1/2283; H01Q 1/38; H01Q 1/422; H01Q 1/526; H01Q 9/0414; H01Q 21/065;
(Continued)

(56) References Cited

U.S. PATENT DOCUMENTS

| 10,186,756 B2 | 1/2019 | Dalmia | |
|---|---|---|---|
| 2018/0034134 A1* | 2/2018 | Dalmia | ................. H01Q 1/243 |
| 2019/0103682 A1* | 4/2019 | Thai | .................... H01Q 21/064 |

FOREIGN PATENT DOCUMENTS

WO     2016056387 A1     4/2016

OTHER PUBLICATIONS

International Search Report and Written Opinion for International Patent Application No. PCT/US2022/074363, mailed Nov. 17, 2022, 18 pages.

* cited by examiner

*Primary Examiner* — David E Lotter
(74) *Attorney, Agent, or Firm* — Withrow & Terranova, PLLC

(57) ABSTRACT

Multi-sided antenna modules employing antennas on multiple sides of a package substrate for enhanced antenna coverage, and related antenna module fabrication methods. The multi-sided antenna module includes an integrated circuit (IC) die(s) disposed on a first side of the package substrate. The multi-sided antenna module further includes first and second substrate antenna layers disposed on respective first and second sides of the package substrate. The first substrate antenna layer includes a first antenna(s) disposed on the first side of the package substrate adjacent to the IC die(s). The second substrate antenna layer includes a second antenna(s) disposed on the second side of the package substrate opposite of the first side of the package substrate. In this manner, the multi-sided antenna module, including antennas on multiple sides of the package substrate, provides antenna coverage that extends from both sides of the package substrate to provide multiple directions of coverage.

32 Claims, 12 Drawing Sheets

(51) Int. Cl.
*H01Q 1/42* (2006.01)
*H01Q 1/52* (2006.01)
*H01Q 9/04* (2006.01)
*H01Q 21/06* (2006.01)

(52) U.S. Cl.
CPC ......... *H01Q 9/0414* (2013.01); *H01Q 21/065* (2013.01)

(58) Field of Classification Search
CPC ...... H01Q 21/28; H01Q 23/00; H01Q 25/005; H01L 25/0655; H01L 25/50; H01L 23/552; H01L 2223/6677; H01L 23/66
See application file for complete search history.

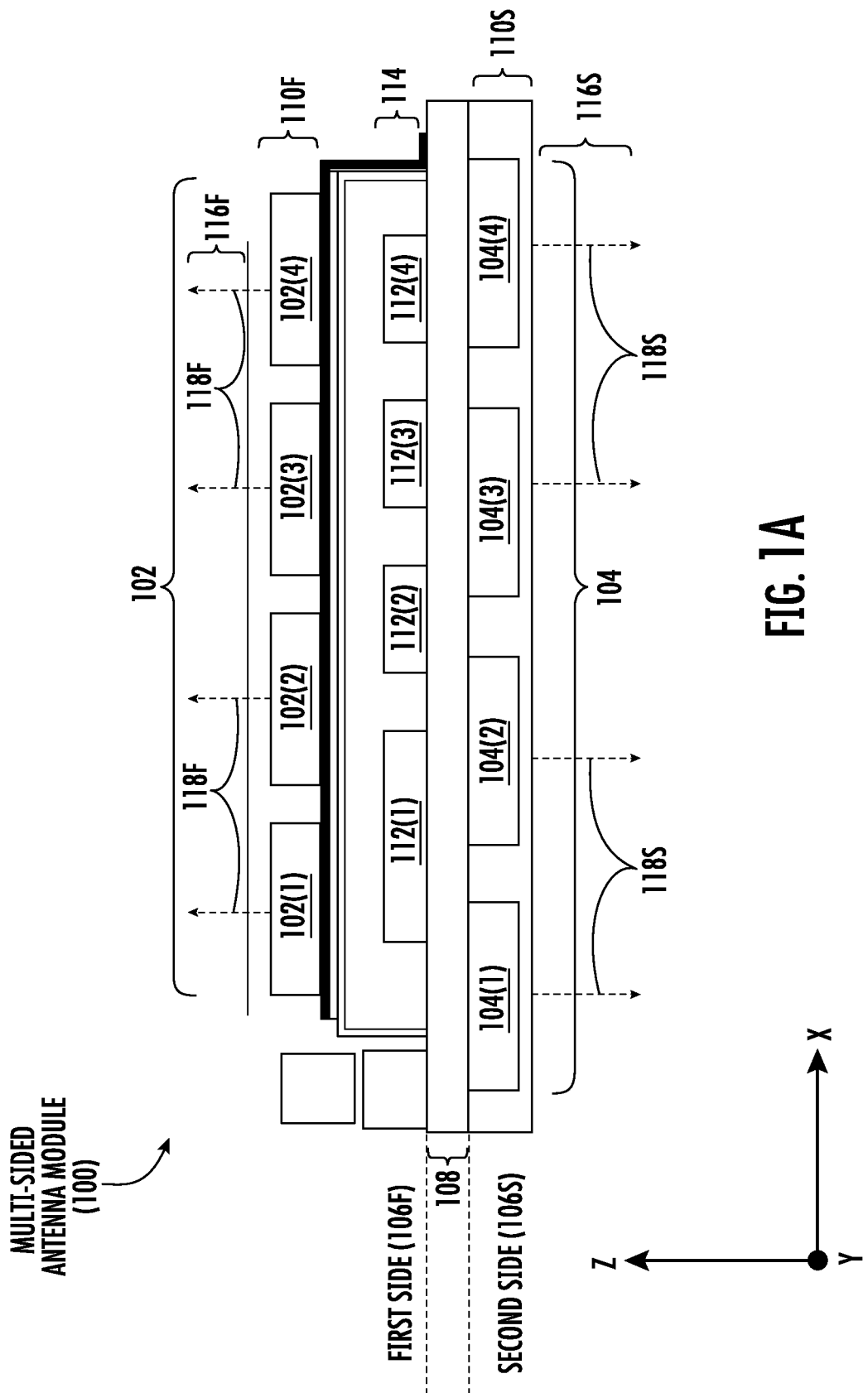

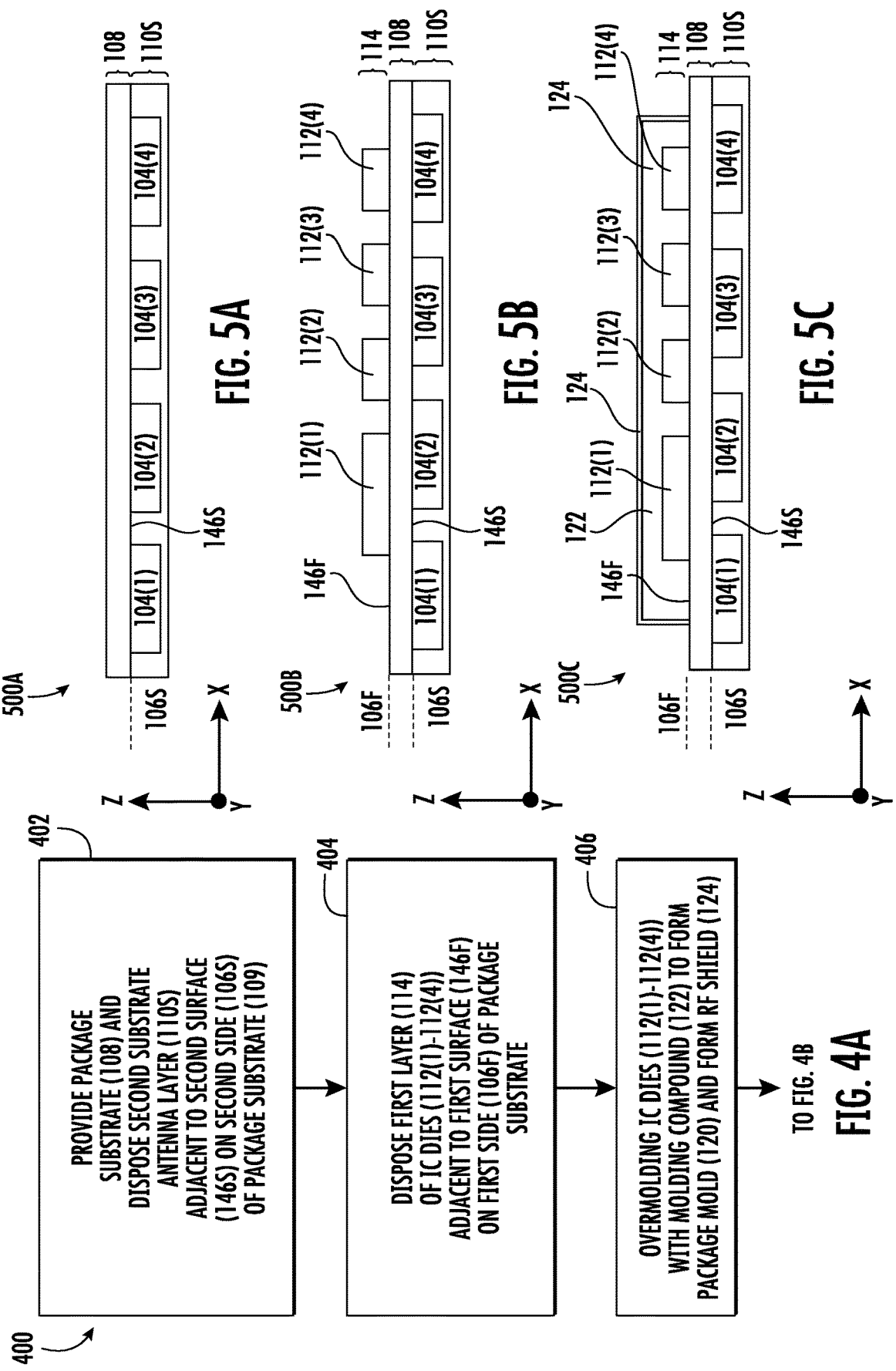

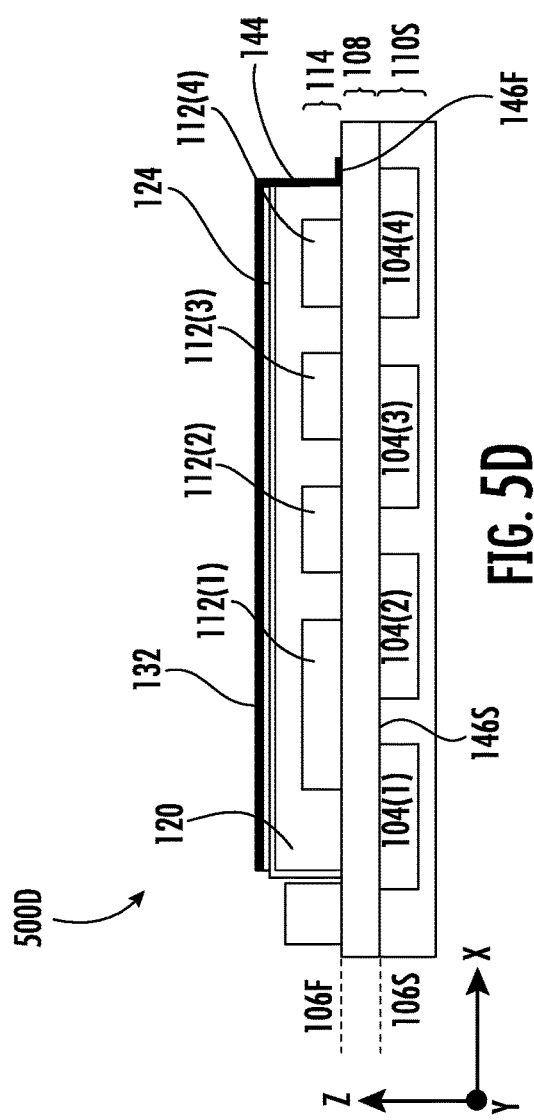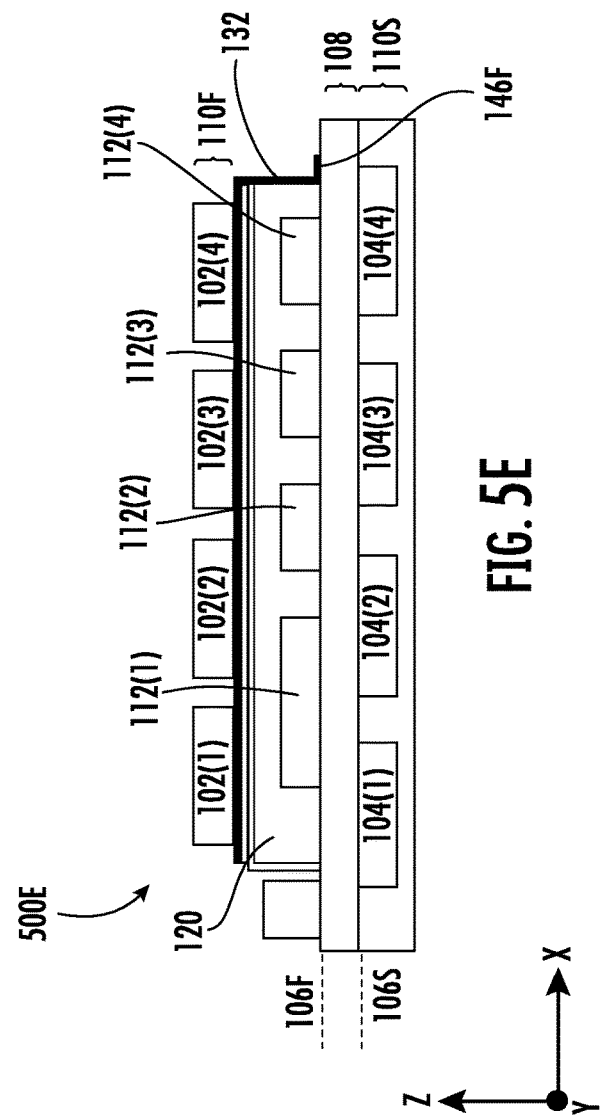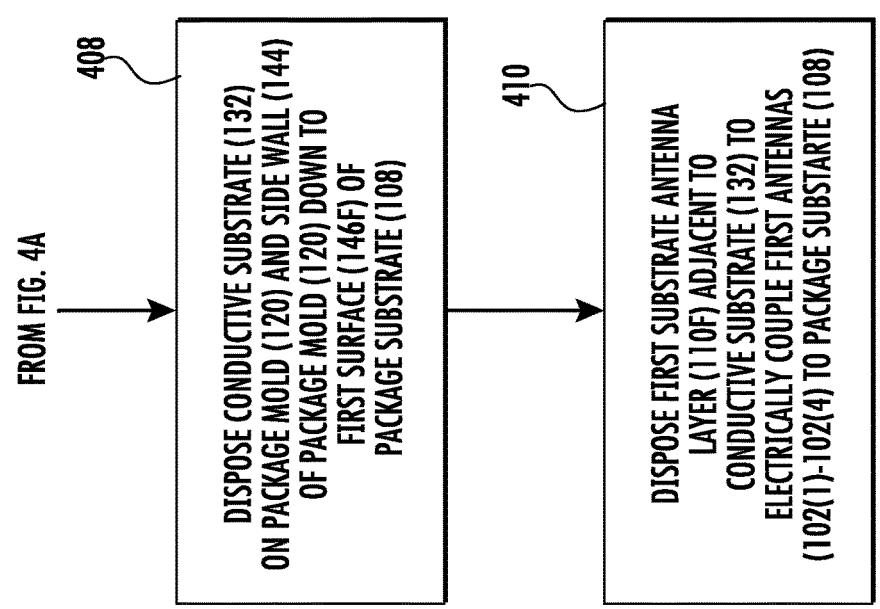

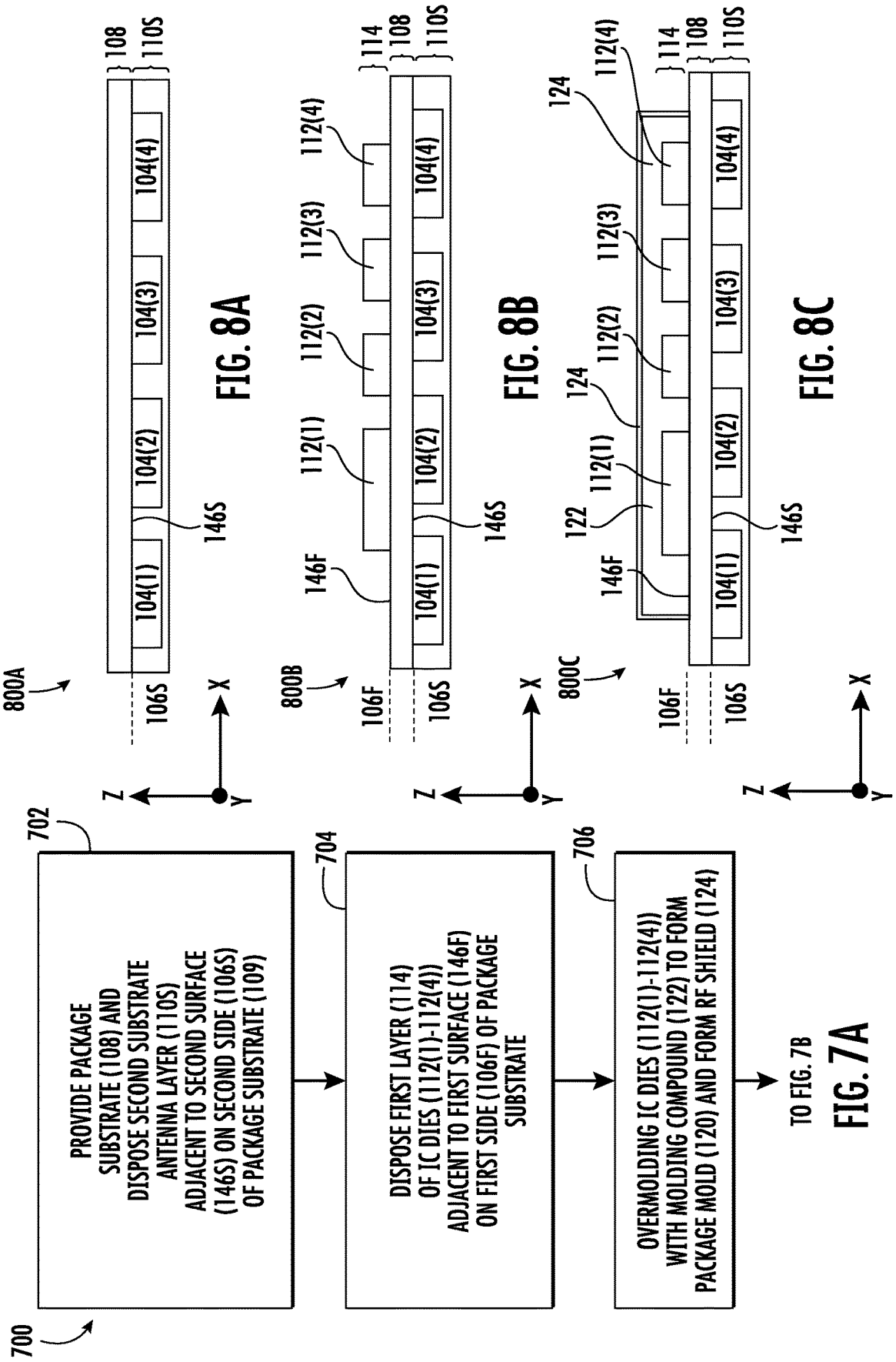

708 — FORM VERTICAL CHANNELS (602(1)-602(4)) IN PACKAGE MOLD (126) AND FORM METAL INTERCONNECTS (604(1)-604(4)) IN VERTICAL CHANNELS (602(1)-602(4)) AND IN ELECTRICAL CONTACT WITH PACKAGE SUBSTRATE (108)

710 — DISPOSE FIRST ANTENNAS (102(1)-102(4)) OVER PACKAGE MOLD (120) AND STRADDLING VERTICAL CHANNELS (602(1)-602(4)) AND ELECTRICALLY COUPLED TO METAL INTERCONNECTS (604(1)-604(4))

FROM FIG. 7A

MULTI-SIDED ANTENNA MODULE EMPLOYING ANTENNAS ON MULTIPLE SIDES OF A PACKAGE SUBSTRATE FOR ENHANCED ANTENNA COVERAGE, AND RELATED FABRICATION METHODS

BACKGROUND

I. Field of the Disclosure

The field of the disclosure relates to an antenna module (also referred to as "antenna-in-package" (AiP) that integrates an antenna with an integrated circuit (IC) packages to integrate a radio-frequency (RF) chip(s) with an antenna(s).

II. Background

Modern smart phones and other portable devices have extended the use of different wireless links with a variety of technologies in different radio frequency bands. For example, fifth generation (5G) cellular networks, commonly referred to as 5G new radio (NR) include frequencies in the range of 24.25 to 86 Gigahertz (GHz), with the lower 19.25 GHz (24.25-43.5 GHz) more likely to be used for mobile devices. This frequency spectrum of 5G communications is in the range of millimeter wave (mmWave) or millimeter band. mmWave enables higher data rates than at lower frequencies, such as those used for Wi-Fi and current cellular networks.

Radio-frequency (RF) transceivers that support mmWave spectrum are incorporated into mobile and other portable devices that are designed to support mmWave communications signals. To support the integration of a RF transceiver in a device, the RF transceiver can be integrated in RF integrated circuit (IC) (RFIC) transceiver chips ("RFIC chips") that are provided as part of an IC package, also referred to as an RFIC package. A conventional RFIC package includes one or more RFIC chips, a power management IC (PMIC), and passive electrical components (e.g., inductors, capacitors, etc.) mounted to one side of a package substrate as a support structure. The package substrate supports metallization structures to provide chip-to-chip and external signal interfaces to the RFIC chip(s). An RFIC package can be provided as an antenna module if it is desired to integrate one or more antennas with a RFIC chip(s) in the same package. This is also referred to as an "antenna-in-package" (AiP). In an antenna module, one or more antennas that can receive and radiate electrical RF signals as electro-magnetic (EM) signals are directly incorporated into the IC package. The antenna module may include a plurality of antennas, also referred to an antenna array, to provide a signal coverage in a desired, larger area around the IC package. The antenna elements can be mounted to a package substrate of the IC package and electrically coupled through one or more metallization structures in the package substrate to the RFIC chip(s) in the antenna module. For example, the RFIC chip(s) may be mounted to a first planar surface on a first, top side of the package substrate of the antenna module, and the antenna array mounted to a second planar surface on a second, bottom side of the package substrate opposite of the first side to provide a planar antenna module. The radiation pattern of the antennas extend in a direction out from and orthogonal to the second planar surface to provide directional antenna coverage. Multiple antenna modules can be provided in different physical locations in a RF device, such as a mobile phone for example, to provide antenna coverage in multiple directions.

SUMMARY OF THE DISCLOSURE

Aspects disclosed in the detailed description include a multi-sided antenna module employing antennas on multiple sides of a package substrate for enhanced antenna coverage. Related antenna module fabrication methods are also disclosed. The antenna module includes a layer that includes one or more integrated circuit (IC) dies (e.g., radio-frequency (RF) IC (RFIC) dies) disposed on a first side of the package substrate. The package substrate provides mounting support for the IC dies and also includes one or more metallization layers that include metal interconnects to provide an electrical interface for signal routing to the IC dies. In exemplary aspects, to include additional directions of antenna coverage in the multi-sided antenna module, the multi-sided antenna module further includes first and second substrate antenna layers disposed on respective first and second sides of the package substrate. The first substrate antenna layer includes one or more first antennas disposed on the first side of the package substrate adjacent to the IC die(s). The second substrate antenna layer includes one or more second antennas disposed on the second side of the package substrate opposite of the first side of the package substrate. The first and second antennas in the respective first and second substrate antenna layers are electrically coupled to the IC die(s) through metal interconnects in the metallization layer(s) of the package substrate. The first antenna(s) of the first substrate antenna layer has an antenna radiation pattern that extends in a first direction out from the first side of the package substrate. For example, the first antenna(s) may include a patch antenna(s) that is oriented in parallel to a first surface on the first side of the package substrate to provide an antenna radiation pattern that extends in a direction out, away from the first side of the package substrate, and orthogonal to package substrate. The second antenna(s) of the second substrate antenna layer has an antenna radiation pattern that extends in a second direction out from the second side of the package substrate. For example, the second antenna(s) may include a patch antenna(s) that is oriented in parallel to a second surface on the second side of the package substrate to provide an antenna radiation pattern that extends in a direction out, away from the second side of the package substrate, and orthogonal to package substrate.

In this manner, the multi-sided antenna module including antennas on multiple sides of the package substrate provides antenna coverage that extends from both sides of the package substrate to provide multiple directions of antenna coverage. By providing a multi-sided antenna module employing antennas on multiple sides of a package substrate, additional antenna coverage directions can be achieved for an RF device that incorporates the multi-sided antenna module, and with less antenna modules than would otherwise be needed if such antenna modules had single directions of antenna coverage. Since each multi-sided antenna module includes an IC die(s), employing the multi-sided antenna module can reduced the number of IC dies employed in the RF device to achieve the desired multi-directional antenna coverage for a reduced cost and reduction in the area needed in the RF device for such antenna modules.

In another exemplary aspect, interference between the IC dies and the first substrate antenna layer on the first side of the package substrate can be mitigated by an RF shield that is disposed between the IC dies and the first substrate antenna layer. For example, the first substrate antenna layer may be mounted to a layer surface(s) that is disposed over the RF shield on the first side of the package substrate.

There are different exemplary aspects in which the first antenna(s) disposed on the first side of the package substrate of the multi-sided antenna module can be electrically coupled to the package substrate for electrical connectivity to the IC die(s). In one exemplary aspect, the first antenna(s) is coupled to a layer stack disposed on the RF shield for the IC die(s). The layer stack includes a metal layer (e.g. a copper layer) that extends on the surface of the RF shield and down a side wall of a package mold formed over the IC die(s) to extend down to metal pads on a first surface on the first side of the package substrate. The metal pads are electrically coupled to metal interconnects in an upper metallization layer, adjacent to the first surface on the first side of the package substrate, that is in turn electrically coupled to the RFIC die(s). In another exemplary aspect, to couple the first antenna(s) to the package substrate for electrical connectivity to the IC die(s), vertical channels are formed in the package mold, adjacent to sides of the IC die(s). The vertical channels extend down to a first surface of the package substrate. An RF shield can be disposed over the package mold after the vertical channels are formed so that the RF shield is disposed around the package mold surrounding an RFIC die(s). Metal interconnects are formed in the vertical channels and coupled to metal interconnects in an upper metallization layer, adjacent to the first surface on the first side of the package substrate, that is in turn electrically coupled to the RFIC die(s). The first antenna(s) is mounted above the vertical channels, extending between top surfaces of each side of a vertical channel(s) in the package mold. The first antenna(s) is electrically coupled to the metal interconnects formed in the vertical channels.

In this regard, in one exemplary aspect, an antenna module is provided. The antenna module comprises a package substrate comprising a first side and a second side opposite the first side. The antenna module also comprises a first substrate antenna layer disposed on the first side of the package substrate, the first substrate antenna layer comprising one or more first antennas. The antenna module also comprises a first layer comprising one or more IC dies. The first layer is disposed on the first side of the package substrate between the package substrate and the first substrate antenna layer. The antenna module also comprises a second substrate antenna layer disposed on the second side of the package substrate, the second substrate antenna layer comprising one or more second antennas.

In another exemplary aspect, a method of fabricating an antenna module is provided. The method comprises providing a package substrate comprising a first surface on a first side and a second surface on a second side, opposite the first side. The method also comprises disposing a second substrate antenna layer comprising one or more second antennas adjacent to the second surface on the second side of the package substrate. The method also comprises disposing a first layer comprising one or more integrated circuit (IC) dies adjacent to the first surface on the first side of the package substrate. The method also comprises disposing a first substrate antenna layer comprising one or more first antennas adjacent to the first layer, such that the first layer is disposed between the first substrate antenna layer and the package substrate on the first side of the package substrate.

BRIEF DESCRIPTION OF THE FIGURES

FIGS. 1A-1C are side views of an exemplary multiple (multi-) sided antenna module employing antennas on multiple sides of a package substrate for enhanced antenna coverage;

FIGS. 4A and 4B is a flowchart illustrating another exemplary fabrication process for fabricating a multi-sided antenna module employing antennas on multiple sides of a package substrate and employing an outer substrate with integrated metal layer for mounting a second antenna(s) on the IC die side of the package substrate and electrically coupling the second antenna(s) to the package substrate, including, but not limited to, the multi-sided antenna module in FIGS. 1A-1C;

FIGS. 5A-5E illustrate exemplary fabrication stages during fabrication of a multi-sided antenna module according to the exemplary fabrication process in FIGS. 4A and 4B;

FIGS. 7A and 7B is a flowchart illustrating another exemplary fabrication process for fabricating a multi-sided antenna module employing antennas on multiple sides of a package substrate for enhanced antenna coverage, and with metal interconnects disposed in channels formed in the package mold of the IC die(s) down to a first surface on a first side of the package substrate to electrically connect the second antenna on the first side of the package substrate to the package substrate, including, but not limited to, the multi-sided antenna module in FIG. 6;

FIGS. 8A-8E illustrate exemplary fabrication stages during fabrication of a multi-sided antenna module according to the exemplary fabrication process in FIGS. 4A and 4B;

DETAILED DESCRIPTION

Figure 1B:
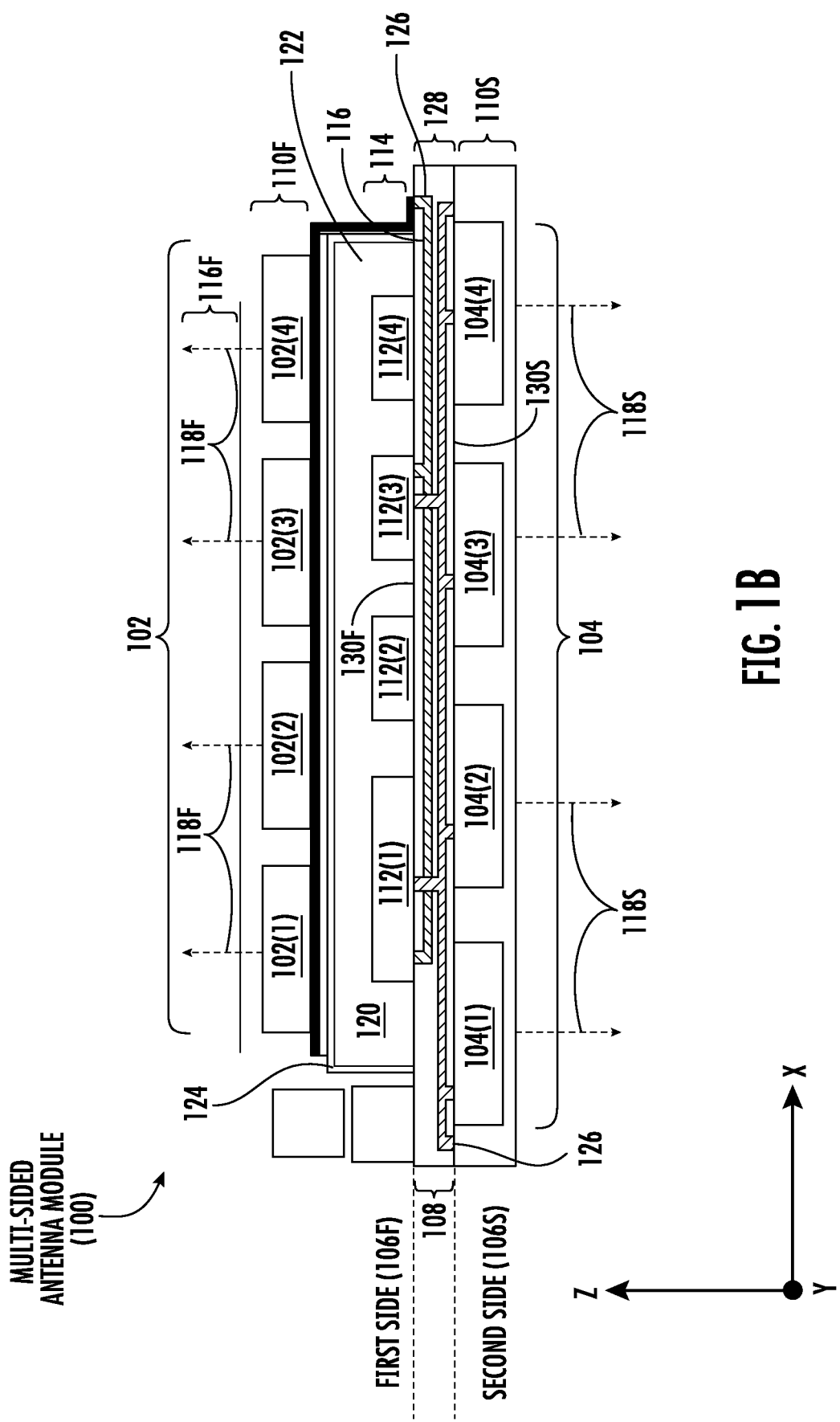

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a multi-sided antenna module employing antennas on multiple sides of a package substrate for enhanced antenna coverage. Related antenna module fabrication methods are also disclosed. The multi-sided antenna module includes a layer that includes one or more integrated circuit (IC) dies (e.g., radio-frequency (RF) IC (RFIC) dies) disposed on a first side of the package substrate. The package substrate provides mounting support for the IC dies and also includes one or more metallization layers that include metal interconnects to provide an electrical interface for signal routing to the IC dies. In exemplary aspects, to include additional directions of antenna coverage in the multi-sided antenna module, the multi-sided antenna module further includes first and second substrate antenna layers disposed on respective first and second sides of the package substrate. The first substrate antenna layer includes one or more first antennas disposed on the first side of the package substrate adjacent to the IC die(s). The second substrate antenna layer includes one or more second antennas disposed on the second side of the package substrate opposite of the first side of the package substrate. The first and second antennas in the respective first and second substrate antenna layers are electrically coupled to the IC die(s) through metal interconnects in the metallization layer(s) of the package substrate. The first antenna(s) of the first substrate antenna layer has an antenna radiation pattern that extends in a first direction out from the first side of the package substrate. For example, the first antenna(s) may include a patch antenna(s) that is oriented in parallel to a first surface on the first side of the package substrate to provide antenna radiation pattern that extends in a direction out, away from the first side of the package substrate, and orthogonal to the package substrate. The second antenna(s) of the second substrate antenna layer has an antenna radiation pattern that extends in a second direction out from the second side of the package substrate. For example, the second antenna(s) may include a patch antenna(s) that is oriented in parallel to a second surface on the second side of the package substrate to provide an antenna radiation pattern that extends in a direction out, away from the second side of the package substrate, and orthogonal to package substrate.

In this manner, the multi-sided antenna module, including antennas on multiple sides of the package substrate, provides antenna coverage that extends from both sides of the package substrate to provide multiple directions of antenna coverage. By providing a multi-sided antenna module employing antennas on multiple sides of a package substrate, additional antenna coverage directions can be achieved for an RF device that incorporates the multi-sided antenna module, and with less antenna modules than would otherwise be needed if such antenna modules had single directions of antenna coverage. Since each multi-sided antenna module includes an IC die(s), employing the multi-sided antenna module can reduced the number of IC dies employed in the RF device to achieve the desired multi-directional antenna coverage for a reduced cost and reduction in the area needed in the RF device for such antenna modules.

Figure 1C:
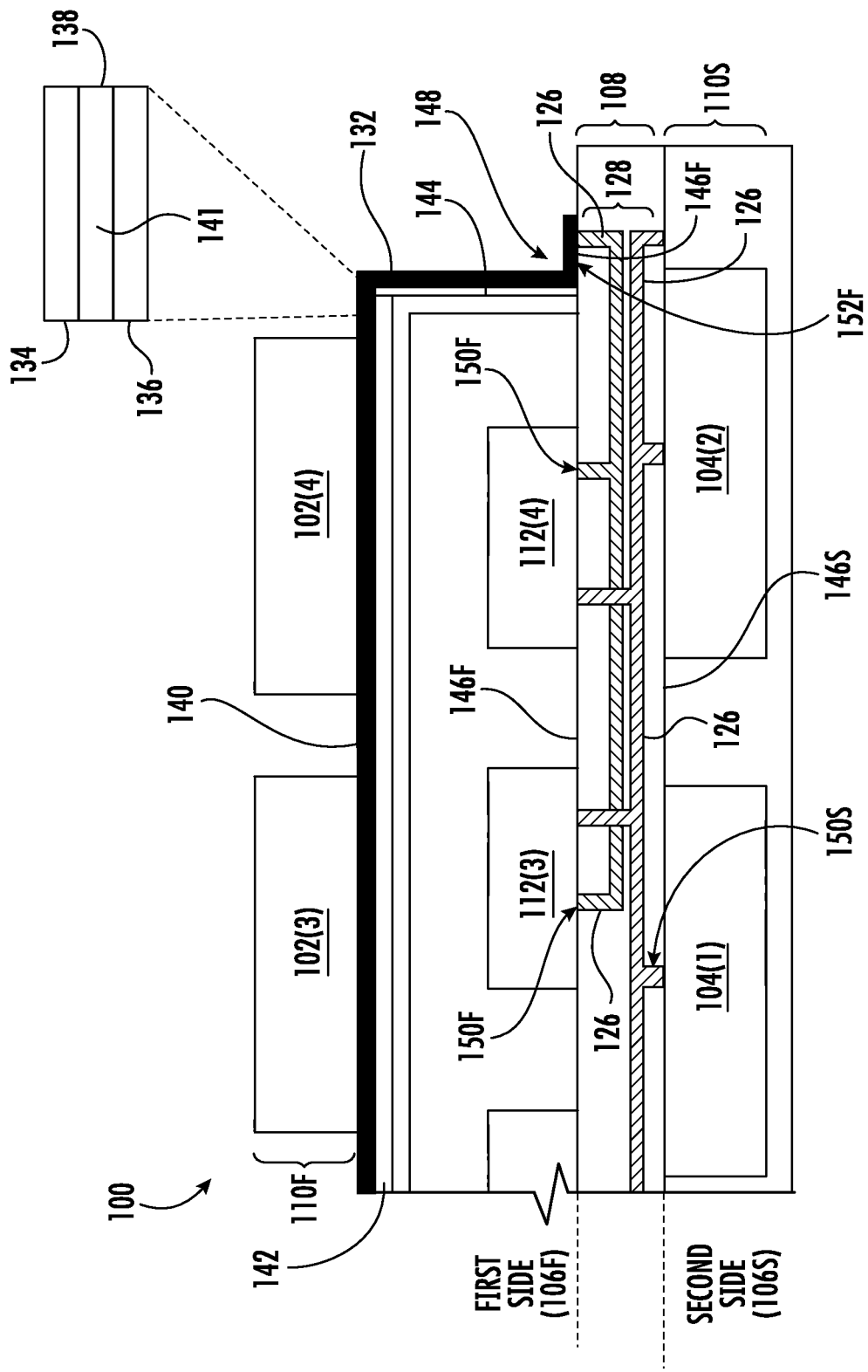

In this regard, FIGS. 1A-1C are side views of an exemplary multiple (multi-) sided antenna module 100 employing first antennas 102 and second antennas 104 on respective first and second sides 106F, 106S of a package substrate 108 for enhanced antenna coverage. In this example, as shown in FIG. 1A, the second antennas 104 are disposed on the second side 106S of the package substrate 108 opposite of the first side 106F where the first antennas 102 are disposed. As discussed in more detail below, to include additional directions of antenna coverage in the multi-sided antenna module 100, the multi-sided antenna module 100 includes a first substrate antenna layer 110F and a second substrate antenna layer 110S disposed on the respective first and second sides 106F, 106S of the package substrate 108. The first substrate antenna layer 110F includes a plurality of first antennas 102(1)-102(4) disposed on the first side 106F of the package substrate 108 adjacent to IC dies 112(1)-112(4) in a first layer 114. For example, the IC dies 112(1)-112(4) could be RFIC dies that include circuitry relating to processing, transmitting and/or receiving RF signals. The IC dies 112(1)-112(4) are electrically coupled through the package substrate 108 to one or more of the first and second antennas 102(1)-102(4), 104(1)-104(4) to receive and transmit RF signals.

In this manner, the multi-sided antenna module 100 in FIG. 1A, including the first and second antennas 102(1)-102(4), 104(1)-104(4) on the first and second sides 106F, 106S of the package substrate 108, provides antenna coverage that extends from both the first and second sides 106F, 106S of the package substrate 108 to provide multiple directions of antenna coverage. The first and second antennas 102(1)-102(4), 104(1)-104(4) have respective first and second antenna radiation patterns 116F, 116S that extend out of the package substrate 108 in first and second directions 118F, 118S, opposite from each other in this example. Thus, in this example, by disposing the first antennas 102(1)-102(4) of the first substrate antenna layer 110F on the first side 106F of the package substrate 108, the first antennas 102(1)-102(4) can be oriented to have first antenna radiation patterns 116F that extend in first directions 118F out from and away from the package substrate 108 in a vertical direction (Z-axis direction). In this regard, the first antenna radiation patterns 116F extend in first directions 118F that do not intersect the package substrate 108. Also, in this example, by disposing the second antennas 104(1)-104(4) of the second substrate antenna layer 110S on the second side 106S of the package substrate 108, the second antennas 104(1)-104(4) can be oriented to have second antenna radiation patterns 116S that extend in a second direction 118S out from the second side 106S of and away from the package substrate 108 in a vertical direction (Z-axis direction). In this regard, the second antenna radiation patterns 116S that extend in second directions 118S that do not intersect the package substrate 108.

FIG. 1B illustrates additional detail of the multi-sided antenna module 100 in FIG. 1A. With reference to FIG. 1B, the IC dies 112(1)-112(4) are encapsulated in a package mold 120 over the IC dies 112(1)-112(4) from an overmolding of the IC dies 112(1)-112(4) with a molding compound 122. An optional RF shield 124 is disposed over the IC dies 112(1)-112(4) in the first layer 114 to shield the IC dies 112(1)-112(4) from electromagnetic (EM) interference. The second substrate antenna layer 110S includes a plurality of second antennas 104(1)-104(4) disposed on the second side 106S of the package substrate 108 opposite of the first side 106F of the package substrate 108 in the vertical direction (Z-axis direction). The first and second antennas 102(1)-102(4), 104(1)-104(4) in the respective first and second substrate antenna layers 110F, 110S are electrically coupled to one or more of the IC dies 112(1)-112(4) through metal interconnects 126 in one or more metallization layers 128 of the package substrate 108.

For example, the first antennas 102(1)-102(4) may be patch antennas that are oriented in parallel to a first surface 130F on the first side 106F of the package substrate 108. This orientation of the first antennas 102(1)-102(4) provides the first antenna radiation pattern 116F (FIG. 1A) that extends in the first direction 118F out and away from the first side 106F of the package substrate 108, and orthogonal to first surface 130F of the package substrate 108 in a vertical direction (Z-axis direction). Similarly, the second antennas 104(1)-104(4) may be patch antennas that are oriented in parallel to a second surface 130S on the second side 106S of the package substrate 108. This orientation of the second antennas 104(1)-104(4) provides the second antenna radiation pattern 116S (FIG. 1A) that extends in the second direction 118S out and away from the first side 106F of the package substrate 108, and orthogonal to second surface 130S of the package substrate 108 in a vertical direction (Z-axis direction).

Figure 2:
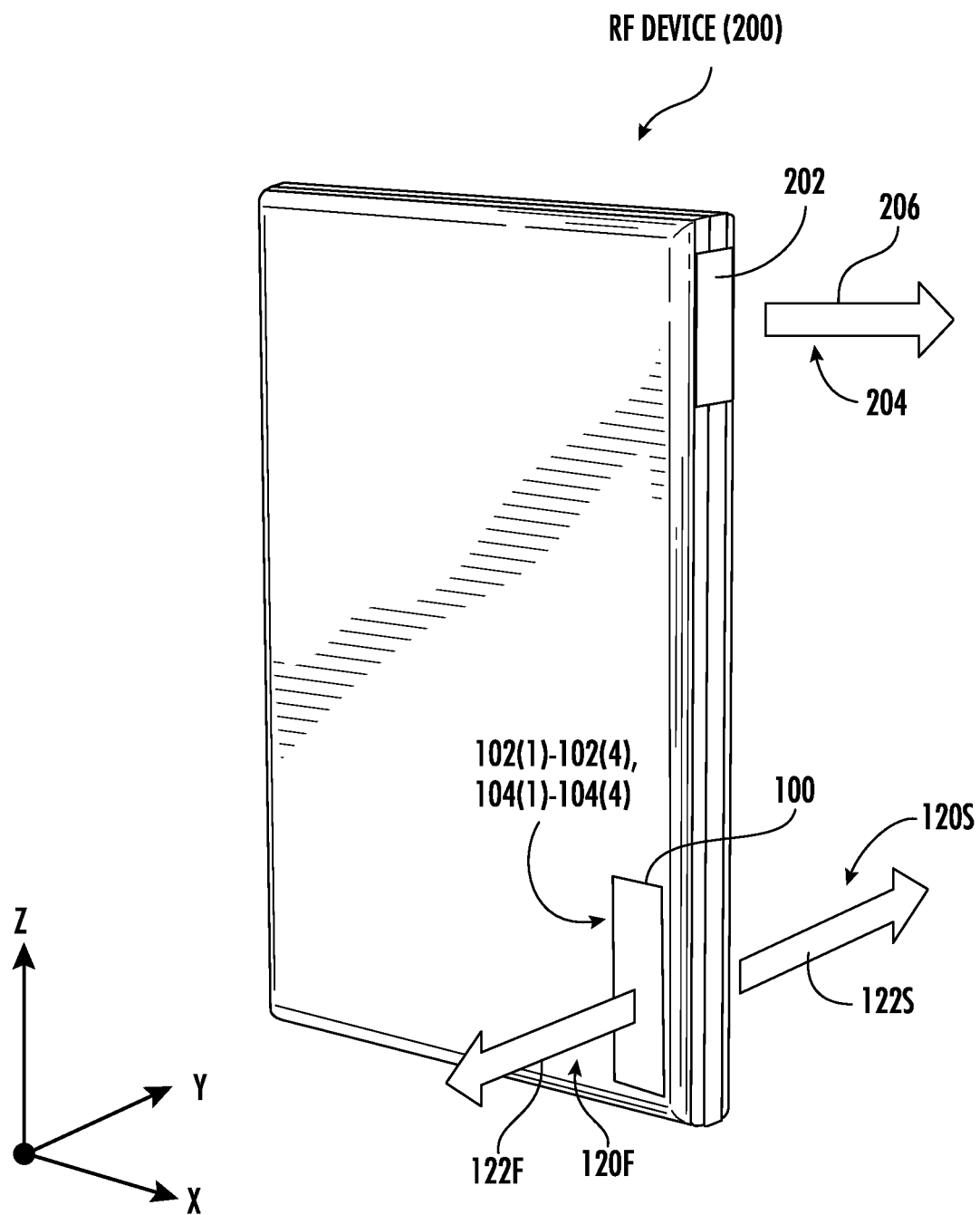
FIG. 2 is a side perspective view of an exemplary radio-frequency (RF) device that includes a multiple (multi-) side antenna module, such as the multi-sided antenna module in FIGS. 1A-1C, employing antennas on multiple sides of a package substrate for enhanced antenna coverage.

Thus, as in the multi-sided antenna module 100 in FIG. 1A, additional antenna coverage directions can be achieved for a RF device that incorporates the multi-sided antenna module 100, and with less antenna modules than would otherwise be needed if such antenna modules had single directions of antenna coverage. Employing the multi-sided antenna module 100 in a RF device can reduce the overall number of IC dies employed in the RF device to achieve the desired multi-directional antenna coverage for a reduced cost and reduction in the area, because less multi-sided antenna module 100 may be required to achieve the desired antenna coverage. This is shown by example, in FIG. 2, which is a side perspective view of an exemplary RF device 200 that includes the multi-sided antenna module 100 in FIG. 1, and another antenna module 202 that does not have multiple direction of antenna coverage. For example, the RF device 200 may be a fifth generation (5G) wireless device that is configured to transmit and receive 5G cellular RF signals in the frequency spectrum of 450 MegaHertz (450 MHz) to 6 GigaHertz (GHz), and 24.25 GHz to 52.6 GH, as a non-limiting examples. As shown in FIG. 2, the multi-sided antenna module 100 has first and second antenna radiation patterns 116F, 116S that extend in the respective first and second directions 118F, 118S out from the multi-sided antenna module 100. The first and second antenna 102(1)-102(4), 104(1)-104(4) in the multi-sided antenna module 100 in the RF device 200 can be designed to support 5G frequency spectrum and thus be 5G antennas. The first and second antenna radiation patterns 116F, 116S that extend in the respective first and second directions 118F, 118S in a horizontal direction (Y-axis direction) in this example, because of the orientation of the RF device 200 in FIG. 2 and how the multi-sided antenna module 100 is oriented in the RF device 200. On the other hand, the antenna module 202 in the RF device 200 only includes antennas on a single side of its package substrate thus having an antenna radiation pattern 116 in a single direction 206.

FIG. 1C is a partial side view of the multi-sided antenna module 100 in FIGS. 1A and 1B to illustrate additional exemplary detail on how the first and second antennas 102(1)-102(4), 104(1)-104(4) can be electrically coupled to the package substrate 108 to support electrical connectivity between the first and second antennas 102(1)-102(4), 104 (1)-104(4) of the first and second substrate antenna layers 110F, 110s and the IC dies 112(1)-112(4). The second antennas 104(1)-104(2) of the second substrate antenna layer 110S are electrically coupled to the IC dies 112(1)-112(4) through the metal interconnects 126 in the metallization layers 128 of the package substrate 108. Because the second antennas 104(1)-104(2) of the second substrate antenna layer 110S are disposed on and directly adjacent to the package substrate 108 without a layer of intervening IC dies on the second side, the second antennas 104(1)-104(2) can be directly coupled to one or more of the IC dies 112(1)-112(4) through the metallization layers 128 of the package substrate 108. Metal interconnects 126 that are electrically coupled to the second antennas 104(1)-104(4) are connected to a metal pad(s) 150F on a second surface 146S of the package substrate 108 that is coupled to one or more of the IC dies 112(1)-112(4).

With continuing reference to FIG. 1C, to electrically couple the first antennas 102(1)-102(4) to one or more of the IC dies 112(1)-112(4), the multi-sided antenna module 100 includes a conductive substrate 132 disposed on a horizontal direction on the package mold 120, between the package mold 120 and the first substrate antenna layer 110F. In this example, the conductive substrate 132 includes a first dielectric layer 134, a second dielectric layer 136, and a conductive layer 138 of a metal material 141 disposed between the first dielectric layer 134 and second dielectric layer 136. The first dielectric layer 134 and second dielectric layer 136 insulate and isolate the conductive layer 138 to prevent shorting the conductive layer 138 and to provide flexibility to the conductive substrate 132 to avoid damage to the conductive layer 138. The conductive layer 138 is disposed on a first surface 140 of the package mold 120 and secured to the package mold 120 through and adhesive layer 142 disposed between the conductive substrate 132 and the package mold 120. To electrically couple the conductive layer 138 to a metal interconnect 126 in a metallization layer 128 of the package substrate 108, the conductive substrate 132 is also disposed on a side wall 144 of the package mold 120 to extend down to a first surface 146F of the package substrate 108. This creates a shoulder area 148 adjacent to the side wall 144 of the package mold 120 and the package substrate 108. The conductive substrate 132 then extends from the side wall 144 of the package mold 120 to the shoulder area 148 in contact with the first surface 146F on the first side 106F of the package substrate 108. A first contact pad 152F is disposed on the first surface 146F of the package substrate 108 that is coupled to the conductive layer 138 of the conductive substrate 132 and a metal interconnect 126 of a metallization layer 128 adjacent to the first surface 146F of the package substrate 108 to provide a signal routing path between the first antennas 102(1)-102(4) and the IC dies 112(1)-112(4).

Figure 3:
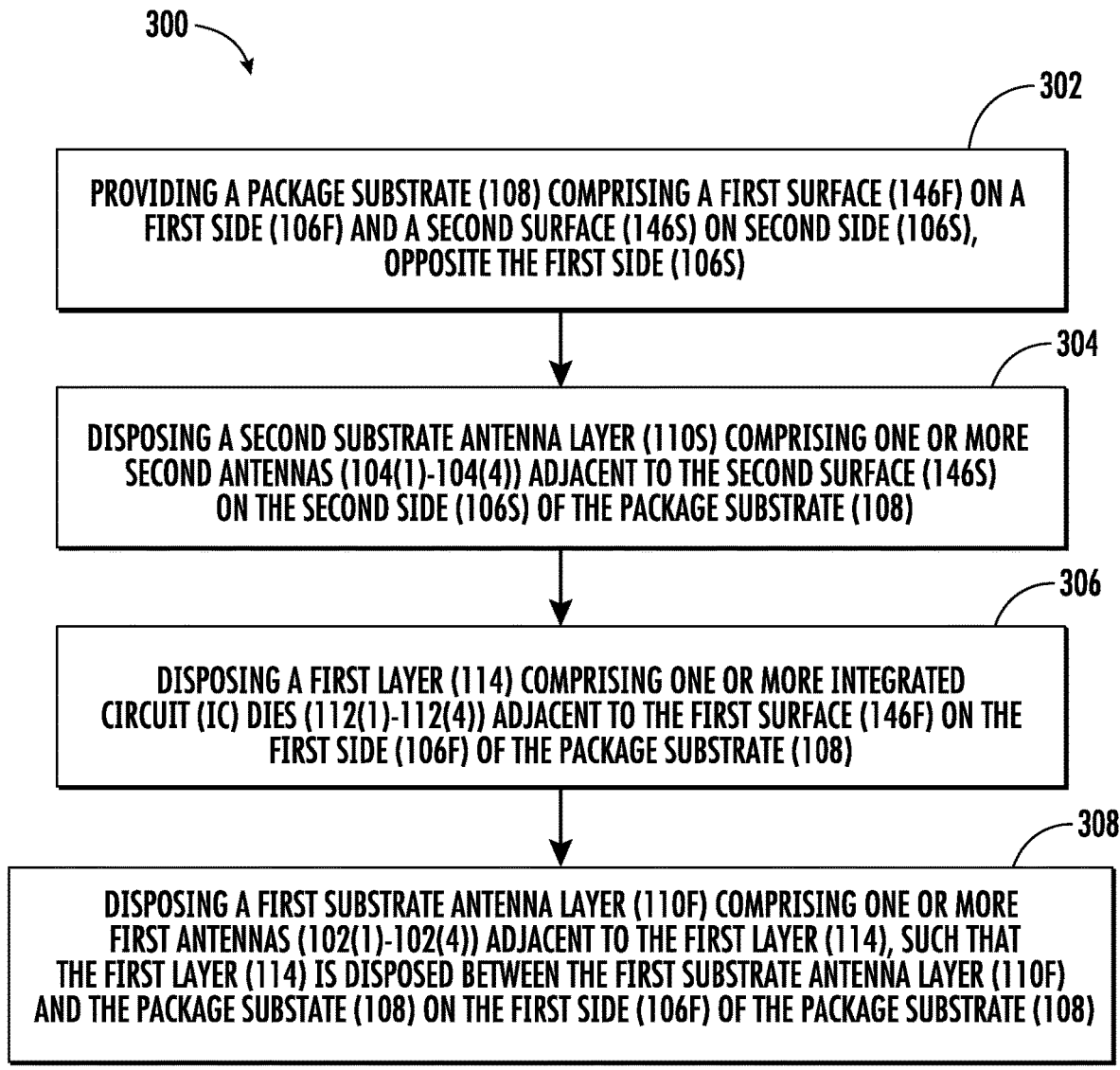
FIG. 3 is a flowchart illustrating an exemplary fabrication process for fabricating the multi-sided antenna module in FIGS. 1A-1C.

A multi-sided antenna module, such as the multi-sided antenna module 100 in FIGS. 1A-1C, can be fabricated according to different fabrication processes. For example, FIG. 3 is a flowchart illustrating an exemplary fabrication process 300 for fabricating a multi-sided antenna module, such as the multi-sided antenna module 100 in FIGS. 1A-1C. The fabrication process 300 in FIG. 3 is discussed with reference to the multi-sided antenna module 100 in FIGS. 1A-1C as an example.

In this regard, a first step in the exemplary fabrication process 300 of fabricating the multi-sided antenna module 100 in FIGS. 1A-1C is providing a package substrate 108 comprising a first surface 146F on a first side 106F and a second surface 146S on second side 106S, opposite the first side 106S (block 302 in FIG. 3). A next step in the exemplary fabrication process 300 of fabricating the multi-sided antenna module 100 is disposing a second substrate antenna layer 110S comprising one or more second antennas 104(1)-104(4) adjacent to the second surface 146S on the second side 106S of the package substrate 108 (block 304 in FIG. 3). A next step in in the exemplary fabrication process 300 of fabricating the multi-sided antenna module 100 is disposing a first layer 114 comprising one or more IC dies 112(1)-112(4) adjacent to the first surface 146F on the first side 106F of the package substrate 108 (block 306 in FIG. 3). A next step in in the exemplary fabrication process 300 of fabricating the multi-sided antenna module 100 is disposing a first substrate antenna layer 110F comprising one or more first antennas 102(1)-102(4) adjacent to the first layer 114, such that the first layer 114 is disposed between the first substrate antenna layer 110F and the package substrate 108 on the first side 106F of the package substrate 108 (block 308 in FIG. 3).

Other fabrication processes can be employed to fabricate the exemplary multi-sided antenna module 100 in FIGS. 1A-1C. In this regard, FIGS. 4A and 4B is a flowchart illustrating another exemplary fabrication process 400 for fabricating the multi-sided antenna module 100 in FIGS. 1A-1C. FIGS. 5A-5E illustrate exemplary fabrication stages 500A-500E during fabrication of the multi-sided antenna module 100 in FIGS. 1A-1C according to the exemplary fabrication process 400 in FIGS. 4A and 4B. The fabrication process 400 in FIGS. 4A and 4B will be discussed in conjunction with the fabrication stages 500A-500E in FIGS. 5A-5E.

In this regard, as shown in the fabrication stage 500A in FIG. 5A, a first step in the fabrication process 400 to fabricate the multi-sided antenna module 100 in FIGS. 1A-1C includes providing the package substrate 108 and disposing the second substrate antenna layer 110S that includes the second antennas 104(1)-104(4) adjacent to the second surface 146S on the second side 106S of the package substrate 108 (block 402 in FIG. 4A). As shown in the fabrication stage 500B in FIG. 5B, a next step in the fabrication process 400 to fabricate the multi-sided antenna module 100 in FIGS. 1A-1C includes disposing a first layer 114 comprising the IC dies 112(1)-112(4) adjacent to the first surface 146F on the first side 106F of the package substrate 108 (block 404 in FIG. 4A). As shown in the fabrication stage 500C in FIG. 5C, a next step in the fabrication process 400 to fabricate the multi-sided antenna module 100 in FIGS. 1A-1C includes overmolding the IC dies 112(1)-112(4) in the first layer 114 with a molding compound 122 to form the package mold 120 on the IC dies 112(1)-112(4) (block 406 in FIG. 4A). The fabrication process 400 can also include forming the RF shield 124 over the IC dies 112(1)-112(4) adjacent to the first layer 114 and package mold 120 to RF shield the IC dies 112(1)-112(4) in the first layer 114 (block 406 in FIG. 4A).

As shown in the fabrication stage 500D in FIG. 5D, a next step in the fabrication process 400 to fabricate the multi-sided antenna module 100 in FIGS. 1A-1C includes disposing the conductive substrate 132 on the package mold 120 and extending the conductive substrate 132 on the side wall 144 of the package mold 120 and in contact with the first surface 146F of the package substrate 108 (block 408 in FIG. 4B). The adhesive layer 142 may be disposed on the package mold 120 first before the conductive substrate 132 is applied to secure the conductive substrate 132 to the package mold 120. As shown in the fabrication stage 500E in FIG. 5E, a next step in the fabrication process 400 to fabricate the multi-sided antenna module 100 in FIGS. 1A-1C includes disposing the first substrate antenna layer 110F with the first antennas 102(1)-102(4) adjacent to the conductive substrate 132 above the package mold 120 such that the first layer 114 of IC dies 112(1)-112(4) is disposed between the first substrate antenna layer 110F and the package substrate 108 on the first side 106F of the package substrate (108) (block 410 in FIG. 4B). The first antennas 102(1)-102(4) are disposed in contact with the conductive substrate 132 to electrically couple the first antennas 102(1)-102(4) to the package substrate 108, and in turn the one or more of the IC dies 112(1)-112(4).

Figure 6:
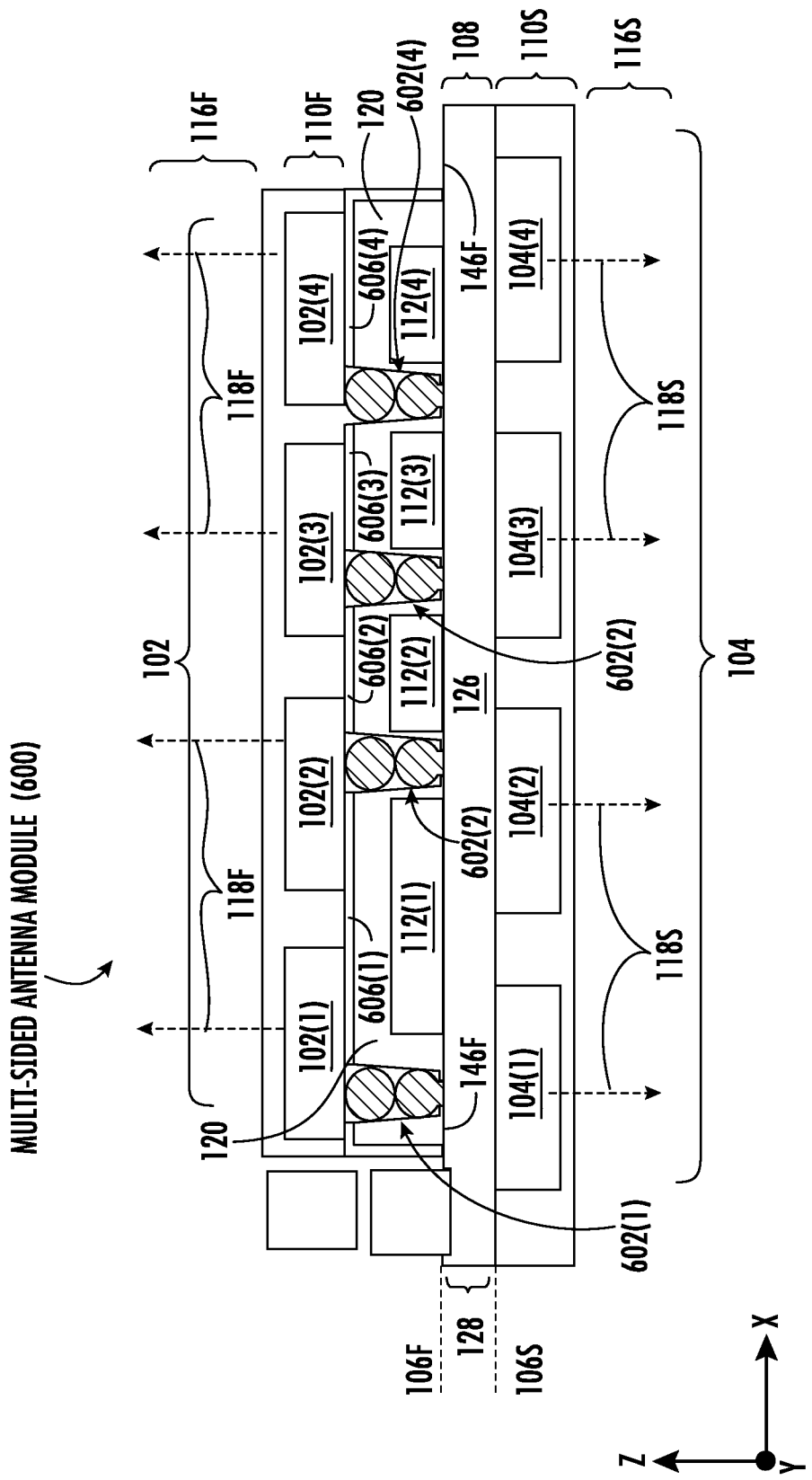
FIG. 6 is a side view of another exemplary multi-sided antenna module employing antennas on multiple sides of a package substrate for enhanced antenna coverage, and with metal interconnects disposed in channels formed in the package mold of the IC die(s) down to a first surface on a first side of the package substrate to electrically connect the second antenna on the first side of the package substrate to the package substrate.

FIG. 6 is a side view of another exemplary multi-sided antenna module 600 that can also employ the first antennas 102 and second antennas 104 on respective first and second sides 106F, 106S of the package substrate 108 for enhanced antenna coverage. Common components between the multi-sided antenna module 600 in FIG. 6 and the multi-sided antenna module 100 in FIGS. 1A-1C are shown with common element numbers. The discussion of these common components in the multi-sided antenna module 100 in FIGS. 1A-1C can also be applicable to the multi-sided antenna module 600 in FIG. 6. As will be discussed below, the multi-sided antenna module 600 in FIG. 6 does not include the conductive substrate 132 like provided in the multi-sided antenna module 100 in FIGS. 1A-1C to electrically couple the first antennas 102(1)-102(4) in the first substrate antenna layer 110F to the package substrate 108. Instead, as discussed in more detail below and illustrated in FIG. 6, multi-sided antenna module 600 includes channels 602(1)-602(4), which are vertical channels 602(1)-602(4) extending in the Z-axis direction in this example. The vertical channels 602(1)-602(4) are disposed between the IC dies 112(1)-112(4) in the first layer 114 to provide areas for respective metal interconnects 604(1)-604(4) to extend down to the package substrate 108. In this manner, a conductive layer does not have to be provided and extend around the side wall of the package mold down to the package substrate 108 like in the multi-sided antenna module 100 in FIGS. 1A-1C.

In this regard, as shown in FIG. 6, vertical channels 602(1)-602(4) are disposed through the package mold 120 down to the first surface 146F of the package substrate 108. The vertical channels 602(1)-602(4) extend in a vertical direction (Z-axis direction) in this example, orthogonal to the first surface 146F of the package substrate 108. For example, the vertical channels 602(1)-602(4) could be laser drilled in the package mold 120 when fabricating the multi-sided antenna module 600. Metal interconnects 604(1)-604(4) formed from a metal material are disposed in vertical channels 602(1)-602(4). The metal interconnects 604(1)-604(4) extend in the vertical channels 602(1)-602(4) down to the first surface 146F of the package substrate 108 and are in contact with metal interconnects 126 in a metallization layer 128 of the package substrate 108. An RF shield material is disposed over the package mold 120 that has the vertical channels 602(1)-602(4) disposed therein to form individual RF shields 606(1)-606(4) for the respective IC dies 112(1)-112(4). Thus, when the first substrate antenna layer 110F with the first antennas 102(1)-102(4) are provided in the multi-sided antenna module 600, the first antennas 102(1)-102(4) are disposed to straddle the respective vertical channels 602(1)-602(4) formed in the package mold 120 and in contact with the metal interconnects 604(1)-604(4) so that the first antennas 102(1)-102(4) can be electrically coupled to the package substrate 108 through the metal interconnects 604(1)-604(4).

The multi-sided antenna module 600 in FIG. 6 can be fabricated according to fabrication process 300 in FIG. 3. The multi-sided antenna module 600 in FIG. 6 can also be fabricated according to other fabrication processes. In this regard, FIGS. 7A and 7B is a flowchart illustrating another exemplary fabrication process 700 for fabricating the multi-sided antenna module 600 in FIG. 6. FIGS. 8A-8E illustrate exemplary fabrication stages 800A-800E during fabrication of the multi-sided antenna module 600 in FIG. 6 according to the exemplary fabrication process 700 in FIGS. 7A and 7B. The fabrication process 800 in FIGS. 7A and 7B will be discussed in conjunction with the fabrication stages 800A-800E in FIGS. 8A-8E.

In this regard, as shown in the fabrication stage 800A in FIG. 8A, a first step in the fabrication process 700 to fabricate the multi-sided antenna module 600 in FIG. 6 includes providing the package substrate 108 and disposing the second substrate antenna layer 110S that includes the second antennas 104(1)-104(4) adjacent to the second surface 146S on the second side 106S of the package substrate 108 (block 702 in FIG. 7A). As shown in the fabrication stage 800B in FIG. 8B, a next step in the fabrication process 700 to fabricate the multi-sided antenna module 600 in FIG. 6 includes disposing a first layer 114 comprising the IC dies 112(1)-112(4) adjacent to the first surface 146F on the first side 106F of the package substrate 108 (block 704 in FIG. 7A). As shown in the fabrication stage 800C in FIG. 8C, a next step in the fabrication process 700 to fabricate the multi-sided antenna module 600 in FIG. 6 includes over-molding the IC dies 112(1)-112(4) in the first layer 114 with a molding compound 122 to form the package mold 120 on the IC dies 112(1)-112(4)(block 706 in FIG. 7A). The fabrication process 700 can also include forming the RF shield 124 over the IC dies 112(1)-112(4) adjacent to the first layer 114 and package mold 120 to RF shield the IC dies 112(1)-112(4) in the first layer 114 (block 706 in FIG. 7A).

As shown in the fabrication stage 800D in FIG. 8D, a next step in the fabrication process 700 to fabricate the multi-sided antenna module 600 in FIG. 6 includes forming the vertical channels 602(1)-602(4) in the package mold 120 down to the first surface 146F of the package substrate 108 (block 708 in FIG. 7B). This forms openings in the RF shield 124 to form separate RF shield 606(1)-606(4) adjacent to the respective IC dies 112(1)0112(4). As an example, the vertical channels 602(1)-602(4) can be formed by laser drilling openings in the package mold 120. Metal material can then be disposed in the vertical channels 602(1)-602(4) to form the metal interconnects 604(1)-604(4) in the vertical channels 602(1)-602(4) electrically coupled to metal interconnects 126 in the package substrate 108 (block 708 in FIG. 7B). Then, as shown in the fabrication stage 800E in FIG. 8D, a next step in the fabrication process 700 to fabricate the multi-sided antenna module 600 in FIG. 6 includes disposing the first antennas 102(1)-102(4) of the first substrate antenna layer 110F over the package mold 120 and over the vertical channels 602(1)-602(4) (block 710 in FIG. 7B). In this example, the are disposed to straddle the respective vertical channels 602(1)-602(4) formed in the package mold 120 and in contact with the metal interconnects 604(1)-604(4) so that the first antennas 102(1)-102(4) can be electrically coupled to the package substrate 108 through the metal interconnects 604(1)-604(4).

Multi-sided antenna modules employing antennas on multiple sides of a package substrate for enhanced antenna coverage, including, but not limited to, the multi-sided antenna module in FIGS. 1A-1C, 5A-5E, 6, and 8A-8E, and according to any of the fabrication processes in FIGS. 3-4B and 7A-7B, and according to any aspects disclosed herein, may be provided in or integrated into any wireless communication device and/or processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 9:
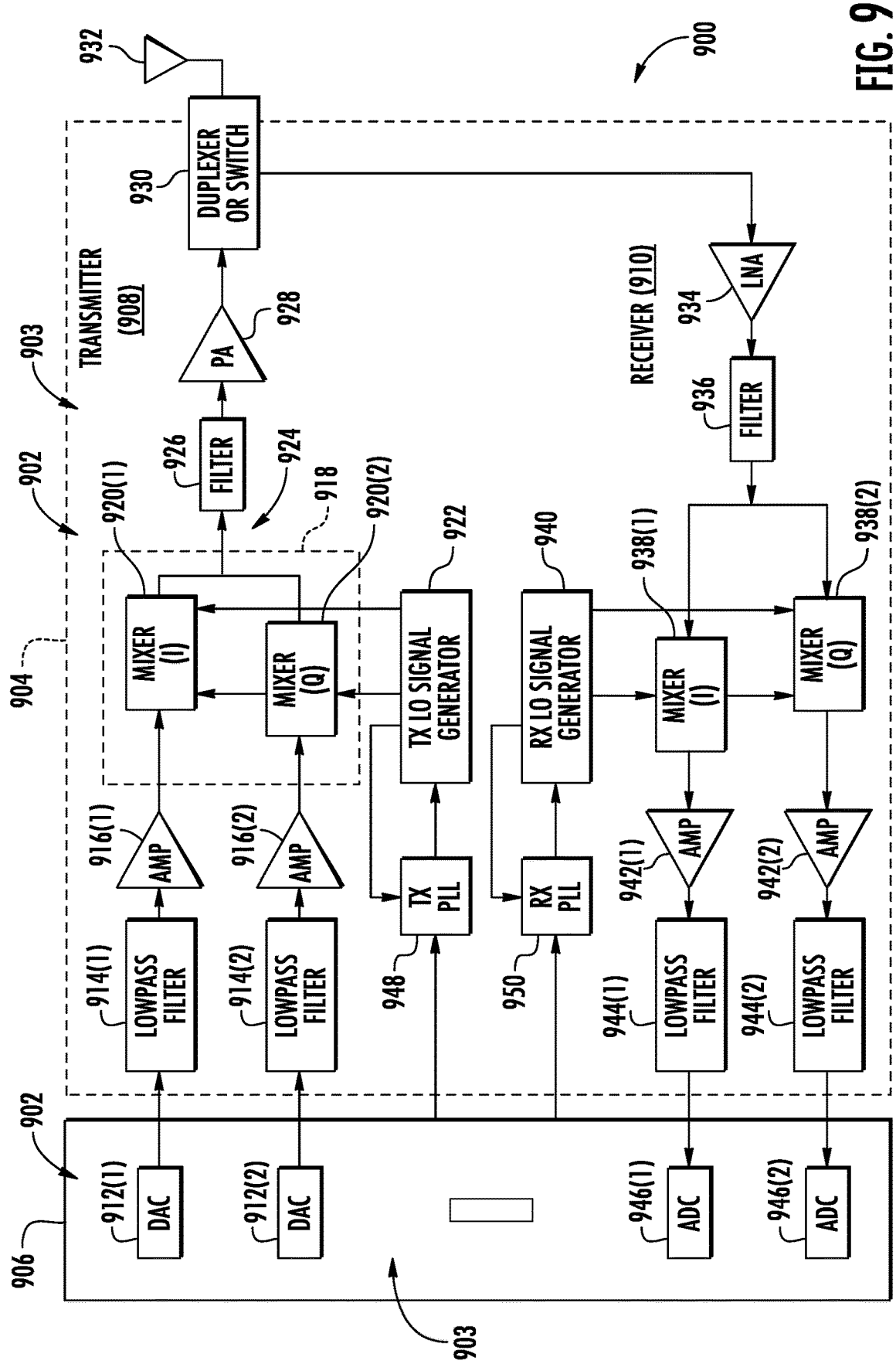
FIG. 9 is a block diagram of an exemplary wireless communications device that includes RF components provided in one or more IC packages, wherein one or more of the IC packages can include multi-sided antenna module employing antennas on multiple sides of a package substrate for enhanced antenna coverage, including, but not limited to, the multi-sided antenna module in FIGS. 1A-1C, 5A-5E, 6, and 8A-8E, and according to any of the fabrication processes in FIGS. 3-4B and 7A-7B.

FIG. 9 illustrates an exemplary wireless communications device 900 that includes RF components formed from one or more ICs 902, wherein any of the ICs 902 can be include a multi-sided antenna module 903 employing antennas on multiple sides of a package substrate for enhanced antenna coverage, including, but not limited to, the multi-sided antenna module in FIGS. 1A-1C, 5A-5E, 6, and 8A-8E, and according to any of the fabrication processes in FIGS. 3-4B and 7A-7B, and according to any aspects disclosed herein. The wireless communications device 900 may include or be provided in any of the above-referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RFICs, mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 914(1), 914(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Figure 10:
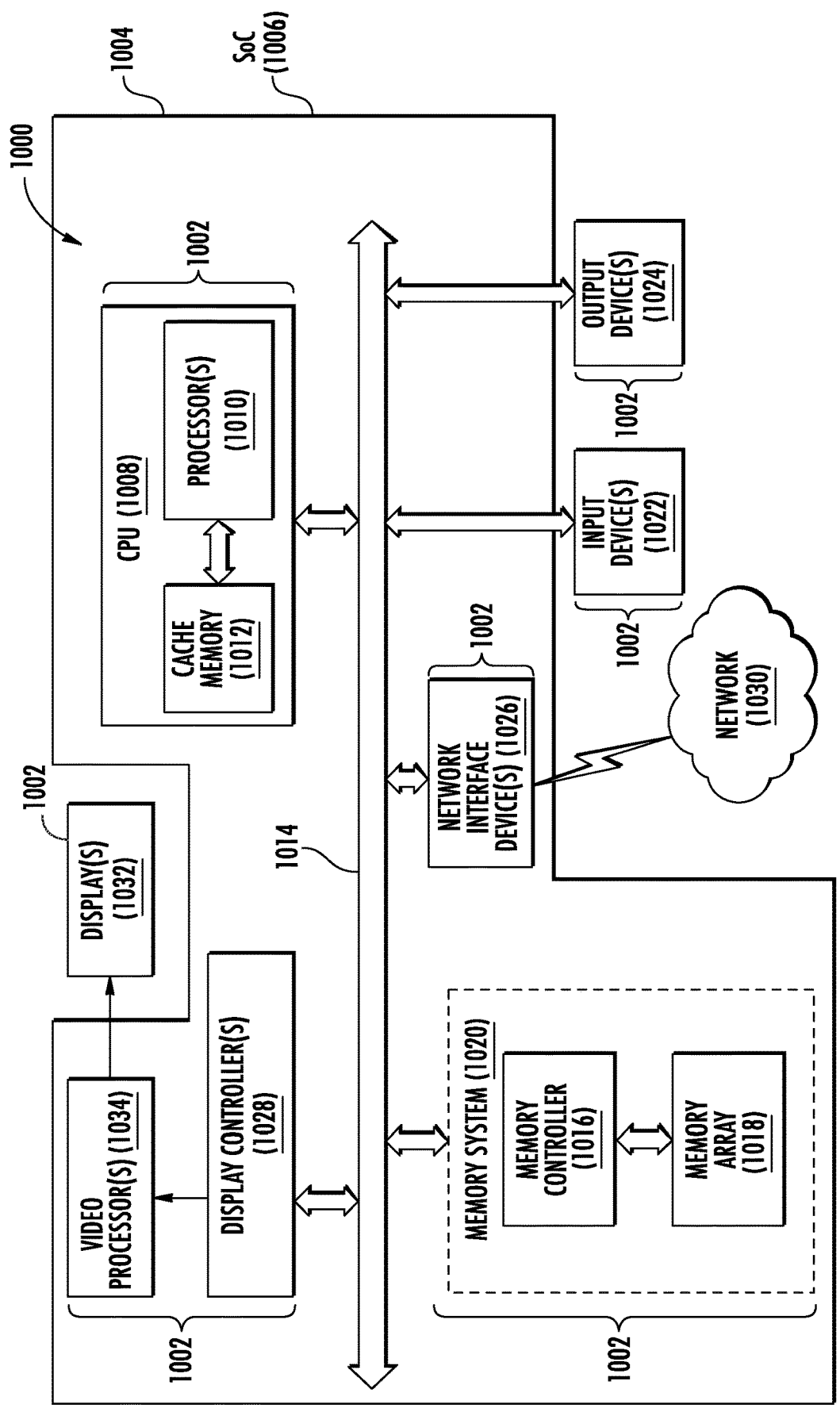
FIG. 10 is a block diagram of an exemplary processor-based system that can includes RF components provided in one or more IC packages, wherein one or more of the IC packages can include multi-sided antenna module employing antennas on multiple sides of a package substrate for enhanced antenna coverage, including, but not limited to, the multi-sided antenna module in FIGS. 1A-1C, 5A-5E, 6, and 8A-8E, and according to any of the fabrication processes in FIGS. 3-4B and 7A-7B.

FIG. 10 illustrates an example of a processor-based system 1000. The components of the processor-based system 1000 are ICs 1002. Some or all of the ICs 1002 in the processor-based system 1000 can be provided as an IC package 1004 employing a multi-sided antenna module 903 employing antennas on multiple sides of a package substrate for enhanced antenna coverage, including, but not limited to, the multi-sided antenna module in FIGS. 1A-1C, 5A-5E, 6, and 8A-8E, and according to any of the fabrication processes in FIGS. 3-4B and 7A-7B, and according to any aspects disclosed herein. In this example, the processor-based system 1000 may be formed as an IC package 1004 as a system-on-a-chip (SoC) 1006. The processor-based system 1000 includes a central processing unit (CPU) 1008 that includes one or more processors 1010, which may also be referred to as CPU cores or processor cores. The CPU 1008 may have cache memory 1012 coupled to the CPU 1008 for rapid access to temporarily stored data. The CPU 1008 is coupled to a system bus 1014 and can intercouple master and slave devices included in the processor-based system 1000. As is well known, the CPU 1008 communicates with these other devices by exchanging address, control, and data information over the system bus 1014. For example, the CPU 1008 can communicate bus transaction requests to a memory controller 1016 as an example of a slave device.

Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that includes the memory controller 1016 and a memory array(s) 1018, one or more input devices 1022, one or more output devices 1024, one or more network interface devices 1026, and one or more display controllers 1028, as examples. Each of the memory systems 1020, the one or more input devices 1022, the one or more output devices 1024, the one or more network interface devices 1026, and the one or more display controllers 1028 can be provided in the same or different IC packages. The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU 1008 may also be configured to access the display controller(s) 1028 over the system bus 1014 to control information sent to one or more displays 1032. The display controller(s) 1028 sends information to the display(s) 1032 to be displayed via one or more video processors 1034, which processes the information to be displayed into a format suitable for the display(s) 1032. The display controller(s) 1028 and video processor(s) 1034 can be included as an IC package 1004 and in the same or different IC packages 1004 from each other, and in the same or different IC packages containing the CPU 1008 as an example. The display(s) 1032 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electro-magnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered aspects/clauses:

1. An antenna module, comprising:
   a package substrate comprising a first side and a second side opposite the first side;
   a first substrate antenna layer disposed on the first side of the package substrate, the first substrate antenna layer comprising one or more first antennas;
   a first layer comprising one or more integrated circuit (IC) dies, the first layer disposed on the first side of the package substrate between the package substrate and the first substrate antenna layer; and
   a second substrate antenna layer disposed on the second side of the package substrate, the second substrate antenna layer comprising one or more second antennas.

2. The antenna module of clause 1, further comprising a radio-frequency (RF) shield disposed between the first layer and the first substrate antenna layer.

3. The antenna module of any of clauses 1-2, wherein:
   the one or more first antennas are electrically coupled to the package substrate; and
   the one or more second antennas are electrically coupled to the package substrate.

4. The antenna module of any of clauses 1-3, further comprising:
   a conductive layer comprising a conductive material disposed between the first layer and the first substrate antenna layer;
   wherein:
      the conductive layer is electrically coupled to each first antenna among the one or more first antennas; and
      the conductive layer is electrically coupled to at least one metal interconnect in a metallization layer of the package substrate.

5. The antenna module of clause 4, further comprising a package mold disposed on the one or more IC dies, the package mold comprising a side wall;
   wherein the conductive layer is further disposed on the side wall of the package mold.

6. The antenna module of clause 5, wherein:
   the package substrate extends in a horizontal direction beyond a vertical plane of the side wall of the package mold, to create a shoulder area adjacent to the side wall of the package mold and the package substrate; and
   the conductive layer extends from the side wall of the package mold to the shoulder area in contact with a first surface on the first side of the package substrate.

7. The antenna module of any of clauses 4-6, further comprising a conductive substrate comprising a first dielectric layer, a second dielectric layer, and the conductive layer disposed between the first dielectric layer and the second dielectric layer;
   the conductive substrate disposed between the first substrate antenna layer and the first layer.

8. The antenna module of any of clauses 5-7, further comprising an adhesive layer disposed between the conductive layer and the package mold, the adhesive layer coupling the conductive layer to the package mold.

9. The antenna module of any of clauses 1-3, further comprising:
   one or more antenna metal interconnects extending from a first surface of the first substrate antenna layer to a first surface on the first side of the package substrate; and
   the one or more antenna metal interconnects each coupled to a first antenna among the one or more first antennas in the first substrate antenna layer and a metal interconnect in a metallization layer of the package substrate.

10. The antenna module of clause 9, further comprising:
    one or more channels extending from the first surface of the first substrate antenna layer to the first surface of the package substrate;
    each antenna metal interconnects among the one or more antenna metal interconnects disposed in a channel among the one or more channels.

11. The antenna module of clause 10, wherein each channel among the one or more channels is adjacent to an IC die among the one or more IC dies in the first layer.

12. The antenna module of any of clauses 10-11, further comprising a package mold disposed on the one or more IC dies;
the one or more channels each extending from a first surface of the first substrate antenna layer, and through the package mold down to the first surface of the package substrate.

13. The antenna module of any of clauses 10-12, wherein each first antenna among the one or more first antennas extends in a horizontal direction across two adjacent channels among the one or more channels.

14. The antenna module of any of clauses 1-13, wherein:
the one or more first antennas are oriented in the first substrate antenna layer to have a first antenna radiation pattern extending in a first direction not intersecting the package substrate; and
the one or more second antennas are oriented in the second substrate antenna layer to have a second antenna radiation pattern extending in a second direction not intersecting the package substrate.

15. The antenna module of any of clauses 1-14, wherein:
the first substrate antenna layer is disposed on a first surface on the first side of the package substrate;
the second substrate antenna layer is disposed on a second surface on the second side of the package substrate;
the one or more first antennas are oriented in the first substrate antenna layer to have a first antenna radiation pattern extending in a first direction orthogonal to first surface of the package substrate; and
the one or more second antennas are oriented in the second substrate antenna layer to have a second antenna radiation pattern extending in a second direction orthogonal to first surface of the package substrate.

16. The antenna module of any of clauses 1-14, wherein:
the first substrate antenna layer is disposed on a first surface on the first side of the package substrate;
the second substrate antenna layer is disposed on a second surface on the second side of the package substrate;
the one or more first antennas are oriented in the first substrate antenna layer to have a first antenna radiation pattern extending in a first direction not intersecting the package substrate and orthogonal to first surface of the package substrate; and
the one or more second antennas are oriented in the second substrate antenna layer to have a second antenna radiation pattern in a second direction not intersecting the package substrate and orthogonal to the second surface of the package substrate.

17. The antenna module of any of clauses 1-16, wherein:
the one or more first antennas comprise one or more first patch antennas each parallel to the package substrate; and
the one or more second antennas comprise one or more second patch antennas each parallel to the package substrate.

18. The antenna module of any of clauses 1-18, antenna comprises a 5G antenna.

19. The antenna module of any of clauses 1-18, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer, a portable computer, a mobile computing device; a wearable computing device; a desktop computer; a personal digital assistant (PDA); a monitor, a computer monitor, a television; a tuner; a radio; a satellite radio; a music player; a digital music player; a portable music player, a digital video player; a video player; a digital video disc (DVD) player, a portable digital video player, an automobile; a vehicle component; an avionics system; a drone; and a multicopter.

20. A method of fabricating an antenna module, comprising:
providing a package substrate comprising a first surface on a first side and a second surface on second side, opposite the first side;
disposing a second substrate antenna layer comprising one or more second antennas adjacent to the second surface on the second side of the package substrate;
disposing a first layer comprising one or more integrated circuit (IC) dies adjacent to the first surface on the first side of the package substrate; and
disposing a first substrate antenna layer comprising one or more first antennas adjacent to the first layer, such that the first layer is disposed between the first substrate antenna layer and the package substrate on the first side of the package substrate.

21. The method of clause 20, further comprising:
electrically coupling the one or more first antennas are to the package substrate; and
electrically coupling the one or more second antennas to the package substrate.

22. The method of any of clauses 20-21, further comprising overmolding the one or more IC dies in the first layer with a molding compound to form a package mold on the one or more IC dies; and
wherein disposing the first substrate antenna layer comprises disposing the first substrate antenna layer comprising the one or more first antennas on the package mold such that the first layer is disposed between the first substrate antenna layer and the package substrate on the first side of the package substrate.

23. The method of clause 22, further comprising forming a radio-frequency (RF) shield adjacent to the first layer to RF shield the one or more IC dies in the first layer.

24. The method of any of clauses 20-23, further comprising forming a conductive layer comprising a conductive material adjacent to the first layer;
wherein disposing the first substrate antenna layer comprises disposing the first substrate antenna layer comprising the one or more first antennas adjacent to the conductive layer, such that the first layer is disposed between the conductive layer and the package substrate on the first side of the package substrate; and
further comprising:
electrically coupling the conductive layer to each first antenna among the one or more first antennas; and
electrically coupling the conductive layer to at least one metal interconnect in a metallization layer of the package substrate.

25. The method of clause 24, further comprising:
overmolding the one or more IC dies in the first layer with a molding compound to form a package mold on the one or more IC dies, the package mold comprising a side wall;
wherein disposing the first substrate antenna layer comprises disposing the first substrate antenna layer comprising the one or more first antennas on the package mold such that the first layer is disposed between the first substrate antenna layer and the package substrate on the first side of the package substrate; and further comprising:

forming the conductive layer on the side wall of the package mold.

26. The method of clause 25, wherein forming the conductive layer further comprises disposing the conductive layer to extend adjacent to the side wall of the package mold to a shoulder area adjacent to the side wall of the package mold, and the package substrate in contact with the first surface of the package substrate.

27. The method of clause 25, further comprising forming a conductive substrate adjacent to the first layer, the conductive substrate comprises a first dielectric layer, a second dielectric layer, and the conductive layer disposed between the first dielectric layer and the second dielectric layer.

28. The method of clause 27, further comprising disposing an adhesive layer between the conductive substrate and the package mold to couple the conductive substrate to the package mold.

29. The method of any of clauses 20-28, further comprising:

forming one or more antenna metal interconnects extending from a first surface of the first substrate antenna layer to a first surface on the first side of the package substrate; and coupling each of the one or more antenna metal interconnects to a first antenna among the one or more first antennas in the first substrate antenna layer and a metal interconnect in a metallization layer of the package substrate.

30. The method of clause 29, further comprising:

forming one or more channels extending from the first surface of the first substrate antenna layer to the first surface on the first side of the package substrate; and disposing each antenna metal interconnect among the one or more antenna metal interconnects disposed in a channel among the one or more channels.

31. The method of clause 30, further comprising overmolding the one or more IC dies in the first layer with a molding compound to form a package overmold on the one or more IC dies; and wherein forming the one or more channels comprises laser drilling the one or more channels in the package overmold to extend from the first surface of the first substrate antenna layer to the first surface on the first side of the package substrate.

What is claimed is:

1. An antenna module, comprising:

a package substrate comprising a first side and a second side opposite the first side;

a first substrate antenna layer disposed on the first side of the package substrate, the first substrate antenna layer comprising one or more first antennas;

a first layer comprising one or more integrated circuit (IC) dies, the first layer disposed on the first side of the package substrate between the package substrate and the first substrate antenna layer;

a second substrate antenna layer disposed on the second side of the package substrate, the second substrate antenna layer comprising one or more second antennas; and a conductive layer disposed horizontally between the first layer and the first substrate antenna layer, the conductive layer continuous under the first substrate antenna layer.

2. The antenna module of claim 1, further comprising a radio-frequency (RF) shield disposed between the first layer and the first substrate antenna layer.

3. The antenna module of claim 1, wherein:

the one or more first antennas are configured to be electrically coupled to the package substrate; and the one or more second antennas are configured to be electrically coupled to the package substrate.

4. The antenna module of claim 1:

wherein the conductive layer comprises a conductive material;

wherein:

the conductive layer is electrically coupled to each one of the first antennas among the one or more first antennas; and the conductive layer is electrically coupled to at least one metal interconnect in a metallization layer of the package substrate.

5. The antenna module of claim 4, further comprising a package mold disposed on the one or more IC dies, the package mold comprising a side wall;

wherein the conductive layer is further disposed on the side wall of the package mold.

6. The antenna module of claim 5, wherein:

the package substrate extends in a horizontal direction beyond a vertical plane of the side wall of the package mold, to create a shoulder area adjacent to the side wall of the package mold and the package substrate; and the conductive layer extends from the side wall of the package mold to the shoulder area in contact with a first surface on the first side of the package substrate.

7. The antenna module of claim 4, further comprising a conductive substrate comprising a first dielectric layer, a second dielectric layer, and the conductive layer disposed between the first dielectric layer and the second dielectric layer;

the conductive substrate disposed between the first substrate antenna layer and the first layer.

8. The antenna module of claim 5, further comprising an adhesive layer disposed between the conductive layer and the package mold, the adhesive layer coupling the conductive layer to the package mold.

9. The antenna module of claim 1, further comprising:

one or more antenna metal interconnects extending from a first surface of the first substrate antenna layer to a first surface on the first side of the package substrate; and the one or more antenna metal interconnects each coupled to a first antenna among the one or more first antennas in the first substrate antenna layer and a metal interconnect in a metallization layer of the package substrate.

10. The antenna module of claim 9, further comprising:

one or more channels extending from the first surface of the first substrate antenna layer to the first surface of the package substrate;

each antenna metal interconnects among the one or more antenna metal interconnects disposed in a channel among the one or more channels.

11. The antenna module of claim 10, wherein each channel among the one or more channels is adjacent to an IC die among the one or more IC dies in the first layer.

12. The antenna module of claim 10, further comprising a package mold disposed on the one or more IC dies;

the one or more channels each extending from a first surface of the first substrate antenna layer, and through the package mold down to the first surface of the package substrate.

13. The antenna module of claim 10, wherein each first antenna among the one or more first antennas extends in a horizontal direction across two adjacent channels among the one or more channels.

14. The antenna module of claim 1, wherein:
the one or more first antennas are oriented in the first substrate antenna layer to have a first antenna radiation pattern extending in a first direction not intersecting the package substrate; and
the one or more second antennas are oriented in the second substrate antenna layer to have a second antenna radiation pattern extending in a second direction not intersecting the package substrate.

15. The antenna module of claim 1, wherein:
the first substrate antenna layer is disposed on a first surface on the first side of the package substrate;
the second substrate antenna layer is disposed on a second surface on the second side of the package substrate;
the one or more first antennas are oriented in the first substrate antenna layer to have a first antenna radiation pattern extending in a first direction orthogonal to first surface of the package substrate; and
the one or more second antennas are oriented in the second substrate antenna layer to have a second antenna radiation pattern extending in a second direction orthogonal to first surface of the package substrate.

16. The antenna module of claim 1, wherein:
the first substrate antenna layer is disposed on a first surface on the first side of the package substrate;
the second substrate antenna layer is disposed on a second surface on the second side of the package substrate;
the one or more first antennas are oriented in the first substrate antenna layer to have a first antenna radiation pattern extending in a first direction not intersecting the package substrate and orthogonal to first surface of the package substrate; and
the one or more second antennas are oriented in the second substrate antenna layer to have a second antenna radiation pattern in a second direction not intersecting the package substrate and orthogonal to the second surface of the package substrate.

17. The antenna module of claim 1, wherein:
the one or more first antennas comprise one or more first patch antennas each parallel to the package substrate; and
the one or more second antennas comprise one or more second patch antennas each parallel to the package substrate.

18. The antenna module of claim 1, antenna comprises a 5G antenna.

19. The antenna module of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

20. A method of fabricating an antenna module, comprising:
providing a package substrate comprising a first surface on a first side and a second surface on second side, opposite the first side;
disposing a second substrate antenna layer comprising one or more second antennas adjacent to the second surface on the second side of the package substrate;
disposing a first layer comprising one or more integrated circuit (IC) dies adjacent to the first surface on the first side of the package substrate;
disposing a first substrate antenna layer comprising one or more first antennas adjacent to the first layer, such that the first layer is disposed between the first substrate antenna layer and the package substrate on the first side of the package substrate; and
disposing a conductive layer horizontally between the first layer and the first substrate antenna layer, the conductive layer continuous under the first substrate antenna layer.

21. The method claim 20, further comprising:
electrically coupling the one or more first antennas are to the package substrate; and
electrically coupling the one or more second antennas to the package substrate.

22. The method of claim 20, further comprising overmolding the one or more IC dies in the first layer with a molding compound to form a package mold on the one or more IC dies; and
wherein disposing the first substrate antenna layer comprises disposing the first substrate antenna layer comprising the one or more first antennas on the package mold such that the first layer is disposed between the first substrate antenna layer and the package substrate on the first side of the package substrate.

23. The method of claim 22, further comprising forming a radio-frequency (RF) shield adjacent to the first layer to RF shield the one or more IC dies in the first layer.

24. The method of claim 20:
wherein the conductive layer comprises a conductive material;
wherein disposing the first substrate antenna layer comprises disposing the first substrate antenna layer comprising the one or more first antennas adjacent to the conductive layer, such that the first layer is disposed between the conductive layer and the package substrate on the first side of the package substrate; and
further comprising:
electrically coupling the conductive layer to each first antenna among the one or more first antennas; and
electrically coupling the conductive layer to at least one metal interconnect in a metallization layer of the package substrate.

25. The method of claim 24, further comprising:
overmolding the one or more IC dies in the first layer with a molding compound to form a package mold on the one or more IC dies, the package mold comprising a side wall;
wherein disposing the first substrate antenna layer comprises disposing the first substrate antenna layer comprising the one or more first antennas on the package mold such that the first layer is disposed between the first substrate antenna layer and the package substrate on the first side of the package substrate; and further comprising:
forming the conductive layer on the side wall of the package mold.

26. The method of claim 25, wherein forming the conductive layer further comprises disposing the conductive layer to extend adjacent to the side wall of the package mold to a shoulder area adjacent to the side wall of the package mold, and the package substrate in contact with the first surface of the package substrate.

27. The method of claim 25, further comprising forming a conductive substrate adjacent to the first layer, the conductive substrate comprises a first dielectric layer, a second dielectric layer, and the conductive layer disposed between the first dielectric layer and the second dielectric layer.

28. The method of claim 27, further comprising disposing an adhesive layer between the conductive substrate and the package mold to couple the conductive substrate to the package mold.

29. The method of claim 20, further comprising:
forming one or more antenna metal interconnects extending from a first surface of the first substrate antenna layer to a first surface on the first side of the package substrate; and
coupling each of the one or more antenna metal interconnects to a first antenna among the one or more first antennas in the first substrate antenna layer and a metal interconnect in a metallization layer of the package substrate.

30. The method of claim 29, further comprising:
forming one or more channels extending from the first surface of the first substrate antenna layer to the first surface on the first side of the package substrate; and
disposing each antenna metal interconnect among the one or more antenna metal interconnects disposed in a channel among the one or more channels.

31. The method of claim 30, further comprising overmolding the one or more IC dies in the first layer with a molding compound to form a package overmold on the one or more IC dies; and
wherein forming the one or more channels comprises laser drilling the one or more channels in the package overmold to extending from the first surface of the first substrate antenna layer to the first surface on the first side of the package substrate.

32. An antenna module, comprising:
a package substrate comprising a first side and a second side opposite the first side;
a first substrate antenna layer disposed on the first side of the package substrate, the first substrate antenna layer comprising one or more first antennas;
a first layer comprising one or more integrated circuit (IC) dies, the first layer disposed on the first side of the package substrate between the package substrate and the first substrate antenna layer;
a second substrate antenna layer disposed on the second side of the package substrate, the second substrate antenna layer comprising one or more second antennas;
a conductive layer comprising a conductive material disposed between the first layer and the first substrate antenna layer, wherein the conductive layer is electrically coupled to each first antenna among the one or more first antennas and is electrically coupled to at least one metal interconnect in a metallization layer of the package substrate;
a package mold disposed on the one or more IC dies, the package mold comprising a side wall, wherein the package substrate extends in a horizontal direction beyond a vertical plane of the side wall of the package mold, to create a shoulder area adjacent to the side wall of the package mold and the package substrate; and
wherein the conductive layer extends from the side wall of the package mold to the shoulder area in contact with a first surface on the first side of the package substrate.

* * * * *